(12) United States Patent
Kishioka

(10) Patent No.: US 7,794,919 B2
(45) Date of Patent: Sep. 14, 2010

(54) COMPOSITION FOR FORMING UNDERLAYER COATING FOR LITHOGRAPHY CONTAINING EPOXY COMPOUND AND CARBOXYLIC ACID COMPOUND

(75) Inventor: Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/551,130

(22) PCT Filed: Apr. 1, 2004

(86) PCT No.: PCT/JP2004/004764

§ 371 (c)(1),
(2), (4) Date: Sep. 29, 2005

(87) PCT Pub. No.: WO2004/090640

PCT Pub. Date: Oct. 21, 2004

(65) Prior Publication Data

US 2006/0234156 A1   Oct. 19, 2006

(30) Foreign Application Priority Data

Apr. 2, 2003   (JP) ............................. 2003-099228

(51) Int. Cl.
*G03F 7/11* (2006.01)
*C08G 59/40* (2006.01)
*H01L 21/027* (2006.01)

(52) U.S. Cl. .................... 430/311; 430/271.1; 430/325; 438/952; 525/208; 528/363; 528/365; 528/367

(58) Field of Classification Search ...................... None
See application file for complete search history.

(56) References Cited

U.S. PATENT DOCUMENTS

| | | | |
|---|---|---|---|
| 4,130,424 A * | 12/1978 | Feit et al. ................. | 430/271.1 |
| 4,469,832 A * | 9/1984 | Singer et al. ................. | 524/160 |
| 5,380,804 A * | 1/1995 | Lees et al. ................. | 525/327.3 |
| 5,498,514 A * | 3/1996 | Nakao et al. ................. | 430/512 |
| 5,521,011 A * | 5/1996 | Ishidoya et al. ............. | 428/413 |
| 5,525,457 A * | 6/1996 | Nemoto et al. ............... | 430/325 |
| 5,693,691 A | 12/1997 | Flaim et al. | |
| 5,919,599 A | 7/1999 | Meador et al. | |
| 6,114,085 A | 9/2000 | Padmanaban et al. | |
| 6,168,908 B1 * | 1/2001 | Suzuki et al. ................ | 430/325 |
| 6,388,039 B1 | 5/2002 | Jung et al. | |
| 6,399,269 B2 * | 6/2002 | Mizutani et al. .......... | 430/270.1 |
| 6,410,209 B1 * | 6/2002 | Adams et al. ................ | 430/311 |
| 6,492,092 B1 | 12/2002 | Foster et al. | |
| 7,038,328 B2 * | 5/2006 | Enomoto et al. ............. | 257/791 |
| 2002/0009595 A1 | 1/2002 | Hong et al. | |
| 2002/0093069 A1 | 7/2002 | Hong et al. | |
| 2002/0127789 A1 | 9/2002 | Hong et al. | |
| 2003/0008237 A1 * | 1/2003 | Pavelchek et al. ......... | 430/271.1 |
| 2003/0018150 A1 * | 1/2003 | Hong et al. ................. | 526/219 |
| 2004/0110096 A1 * | 6/2004 | Kishioka et al. ............ | 430/313 |
| 2005/0181299 A1 * | 8/2005 | Trefonas et al. .......... | 430/270.1 |

FOREIGN PATENT DOCUMENTS

| | | | |
|---|---|---|---|
| GB | 2 357 512 A * | 6/2006 | |
| JP | 58-48048 A * | 3/1983 | |
| JP | 58-107312 A * | 6/1983 | |
| JP | A 6-35201 | 2/1994 | |
| JP | A 6-118656 | 4/1994 | |
| JP | A 10-120939 | 5/1998 | |
| JP | A 10-333336 | 12/1998 | |
| JP | A 11-279523 | 10/1999 | |
| JP | A 2000-294504 | 10/2000 | |
| JP | A 2001-49231 | 2/2001 | |
| JP | A 2001-194799 | 7/2001 | |
| JP | A 2002-47430 | 2/2002 | |
| JP | A 2002-97231 | 4/2002 | |
| JP | A 2002-105137 | 4/2002 | |
| JP | A 2002-128847 | 5/2002 | |
| JP | A 2002-190519 | 7/2002 | |
| JP | A 2002-530696 | 9/2002 | |
| JP | A 2002-539282 | 11/2002 | |
| SU | 1217864 A1 * | 3/1986 | |
| WO | WO-00/53645 A1 * | 9/2000 | |
| WO | WO 02/05035 A1 | 1/2002 | |
| WO | WO 02/086624 A1 | 10/2002 | |

OTHER PUBLICATIONS

English Machine translation of JP 10-120939 from PAJ website and www19.ipdl.ncipi.go.jp(no date).*

(Continued)

*Primary Examiner*—Cynthia Hamilton
(74) *Attorney, Agent, or Firm*—Oliff & Berridge, PLC

(57) ABSTRACT

There is provided an underlayer coating forming composition for lithography that is used in lithography process of manufacture of semiconductor device; and an underlayer coating having a high dry etching rate compared with photoresist. Concretely, it is a composition for forming an underlayer without use of crosslinking reaction by an strong acid catalyst, and an underlayer coating forming composition containing a component having an epoxy group (a polymer, a compound) and a component having a phenolic hydroxyl group, a carboxyl group, a protected carboxyl group or an acid anhydride structure (a polymer, a compound).

8 Claims, No Drawings

OTHER PUBLICATIONS

Derwent-Acc-No. 1986-290577, published 1986, 2 pages, English abstract of SU 1217864 A.*
AN 1986:461729, ENglish abstract of SU 1217864, entered STN Aug. 23, 1986, ACS on STN.*
AN 1983:430757, ACS on STN database, file CAPLUS, English abstract of JP 58048048 a, Hibino et al, entered in STN May 12, 1984 and RN 86249-19-6 cited and from REGistry file, 4 pages.*
Derwent-Acc-No. 1983-40723K, English abstract of JP 58048048 A, Hibino et al, Derwent Information Ltd, from Derwent Week- 198843, 2 pages printed Dec. 1, 2009 from Derwent file of East database.*
Silverstein, Journal of CHemical Education , Jul. 2000, volum 77, No. 7 pp. 849-850.*
Strong acid-Wikipedia, The free encylcopedia down loaded Dec. 1, 2009 3 pages.*
Ding et al "Optimization of Bottom antireflective coating materials for dual damascene process", Advances in Resist TEchnology and Processing, XVII, Francis M. Houlihand, Ed, Proceedings of SPIE , vol. 3999 (no month given ) year 2000 pp. 910-918.*
Lynch et al.; "Properties and Performance of Near UV Reflectivity Control Layers;" Proceedings of SPIE, 1994, vol. 2195, pp. 225-229.
Taylor et al.; "Methacrylate Resists and Antireflective Coatings for 193 nm Lithography;" Proceedings of SPIE, Mar. 1999, vol. 3678. pp. 174-185.
Meador et al.; "Recent Progress in 193 nm Antireflective Coatings;" Proceedings of SPIE, Mar. 199, vol. 3678, pp. 800-809, corrected date Mar. 1999 /ch/ Jun. 13, 2010 for allowance.

* cited by examiner

COMPOSITION FOR FORMING UNDERLAYER COATING FOR LITHOGRAPHY CONTAINING EPOXY COMPOUND AND CARBOXYLIC ACID COMPOUND

TECHNICAL FIELD

The present invention relates to a novel composition for forming underlayer coating for lithography, an underlayer coating formed from the composition and a method for forming photoresist pattern by use of the underlayer coating. In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; a composition for forming the underlayer coating, and a method for forming the underlayer coating. Further, the present invention relates to a composition for forming underlayer coating for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of a substrate have become serious problems. Accordingly, it has been widely studied to provide an anti-reflective coating between the photoresist and the substrate (Bottom Anti-Reflective Coating, BARC) in order to resolve the problem. As the anti-reflective coating, from a viewpoint of easy of use, many considerations have been done on organic anti-reflective coatings made of a light absorbing substance and a polymer compound and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating include high absorbance to light and radioactive rays, no intermixing with the photoresist layer (being insoluble in photoresist solvents), no diffusion of low molecular substances from the anti-reflective coating into the topcoat photoresist upon baking under heating, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

In recent years, in order to solve interconnection delay that has become clear with miniaturization in pattern rule of semiconductor devices, it has been considered to use copper as interconnect material, and to apply Dual Damascene process as interconnect forming method on the semiconductor device. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example JP 2000-294504 A, JP 2002-47430 A, JP 2002-190519 A and WO 02/05035 pamphlet,).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example JP 2002-128847 A).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist.

As the underlayer coating is required to cause no intermixing, a crosslinking reaction is utilized for the formation of the underlayer coating in many cases. And, as the composition for forming such a crosslinkable underlayer coating, a composition comprising a polymer, a crosslinking agent and a sulfonic acid compound as a crosslinking catalyst is used (see, for example U.S. Pat. No. 5,919,599, JP 2000-294504, JP Patent 200247430 and WO 02/05035 pamphlet). However, as the compositions contain a strong acid being the sulfonic acid compound, they are anticipated to have a problem in shelf stability.

Therefore, an underlayer coating formed by use of crosslinking reaction for which no strong acid catalyst is required, and a composition therefor are desired.

In the meanwhile, it is known a technique in which tris (hydroxyalkyl) isocyanurate substituted with an aromatic compound or a an alicyclic compound is used as a broad ultraviolet light absorber (see, for example JP 11-279523 A), and an anti-reflective coating forming composition containing a cyanuric acid compound (see, for example WO 02/86624 pamphlet).

Taking the above-mentioned present status into account, the present inventors have eagerly studied, and as a result of it, found that the use of a compound having an epoxy group (a polymer compound) and a compound having a phenolic hydroxy group, a carboxyl group, a protected carboxyl group or an acid anhydride structure (a polymer compound) makes possible to form an underlayer coating by use of crosslinking reaction for which a strong acid catalyst such as a sulfonic acid compound and the like is not required, and they completed the present invention.

That is, an object of the present invention is to provide a composition for forming underlayer coating that can be used for the production of semiconductor devices, and to provide an underlayer coating for lithography that causes no intermixing with a photoresist applied and formed as an upper layer and that has a high dry etching rate compared with the photoresist, and an underlayer coating forming composition for forming the underlayer coating. Further, another object of the present invention is to provide an underlayer coating formed by use of crosslinking reaction for which no strong acid catalyst is required, a method for forming the underlayer coating and an underlayer coating forming composition therefor.

Further, an object of the present invention is to provide an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating; a composition for forming the underlayer coating. And another object of the present invention is to provide a method for forming underlayer coating for lithography by use of the underlayer coating forming composition, and a method for forming a photoresist pattern.

DISCLOSURE OF INVENTION

The present invention relates to the following aspects:

as a first aspect, an underlayer coating forming composition characterized by comprising a polymer compound having an epoxy group and a polymer compound having a phenolic hydroxyl group, a carboxyl group, a protected carboxyl group or an acid anhydride structure;

as a second aspect, an underlayer coating forming composition characterized by comprising a polymer compound having an epoxy group and a compound with a molecular weight of 2000 or less having at least two phenolic hydroxyl groups, carboxyl groups, protected carboxyl groups or acid anhydride structures;

as a third aspect, an underlayer coating forming composition characterized by comprising a compound with a molecular weight of 2000 or less having at least two epoxy groups and a polymer compound having a phenolic hydroxyl group, a carboxyl group, a protected carboxyl group or an acid anhydride structure;

as a fourth aspect, an underlayer coating forming composition characterized by comprising a polymer compound having a phenolic hydroxyl group, a carboxyl group, a protected carboxyl group or an acid anhydride structure and an epoxy group;

as a fifth aspect, the underlayer coating forming composition as described in the first or third aspect, wherein the polymer compound having a carboxyl group is a compound having acrylic acid or methacrylic acid as a unit structure;

as a sixth aspect, the underlayer coating forming composition as described in the first or third aspect, wherein the polymer compound having a phenolic hydroxyl group is a compound having hydroxystyrene as a unit structure;

as a seventh aspect, the underlayer coating forming composition as described in the third aspect, wherein the compound with a molecular weight of 2000 or less having at least two epoxy groups is a compound having at least three epoxy groups and no aromatic ring structure;

as an eighth aspect, the underlayer coating forming composition as described in the second aspect, wherein the compound with a molecular weight of 2000 or less having at least two carboxyl groups is a compound of formula (1)

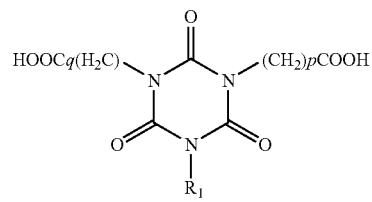

wherein p and q is a number of 1 to 6, $R_1$ is hydrogen atom, $C_{1-6}$ alkyl group, $C_{3-6}$ alkenyl group, benzyl group, phenyl group or —$(CH_2)_r$COOH wherein r is a number of 1 to 6;

as a ninth aspect, the underlayer coating forming composition as described in the third aspect, wherein the compound with a molecular weight of 2000 or less having at least two epoxy groups is a compound of formula (2)

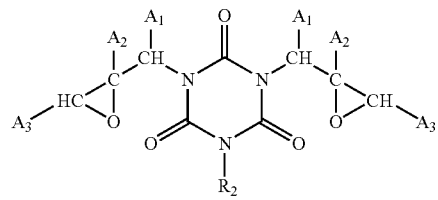

wherein $A_1$, $A_2$ and $A_3$ each are hydrogen atom, methyl group or ethyl group, $R_2$ is hydrogen atom, $C_{1-6}$ alkyl group, $C_{3-4}$ alkenyl group, benzyl group, phenyl group or a group of formula (3)

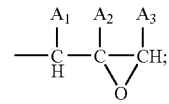

as a tenth aspect, the underlayer coating forming composition as described in the second aspect, wherein the compound with a molecular weight of 2000 or less having at least two phenolic hydroxyl groups is at least one compound selected from the group consisting of a hydroxystyrene oligomer, a substituted bi-phenol compound, a substituted trisphenol compound, a methylolated phenol compound, a methylolated bisphenol compound, a substituted phenol novolak and a substituted cresol novolak;

as an eleventh aspect, the underlayer coating forming composition as described in any one of the first to tenth aspects, further comprising a light absorbing compound;

as a twelfth aspect, a method for forming an underlayer coating for use in manufacture of semiconductor device, comprising coating the underlayer coating forming composition as described in any one of the first to eleventh aspects on a substrate and baking it;

as a thirteenth aspect, a method for forming photoresist pattern for use in manufacture of semiconductor device, comprising coating the underlayer forming composition as described in any one of the first to eleventh aspects on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light; and as a fourteenth aspect, the method for forming photoresist pattern as described in the thirteenth aspect, wherein the exposure to light is carried out with a light of a wavelength of 248 nm, 193 nm or 157 nm.

BEST MODE FOR CARRYING OUT THE INVENTION

The present invention relates to an underlayer coating forming composition comprising a polymer compound having an epoxy group and a polymer compound having a phenolic hydroxyl group, a carboxyl group, a protected carboxyl group or an acid anhydride structure; an underlayer coating forming composition comprising a polymer compound having an epoxy group and a compound with a molecular weight of 2000 or less having at least two phenolic hydroxyl groups, carboxyl groups, protected carboxyl groups or acid anhydride structures; an underlayer coating forming composition comprising a compound with a molecular weight of 2000 or less having at least two epoxy groups and a polymer compound having a phenolic hydroxyl group, a carboxyl group, a protected carboxyl group or an acid anhydride structure; and an underlayer coating forming composition comprising a polymer compound having an epoxy group and a phenolic hydroxyl group, a carboxyl group, a protected carboxyl group or acid anhydride structure.

The underlayer coating forming composition of the present invention basically comprises a polymer compound or a compound with a molecular weight of 2000 or less having an epoxy group, a polymer compound or a compound with a molecular weight of 2000 or less having a phenolic hydroxyl group, a carboxyl group, a protected carboxyl group or an acid anhydride structure, or a polymer compound having a phenolic hydroxyl group, a carboxyl group, a protected carboxyl group or an acid anhydride structure, and a solvent, and as arbitrary components a light absorbing compound, a surfactant or the like. The solid content in the underlayer coating forming composition of the present invention is for example 0.1 to 70 mass %, or for example 0.1 to 50 mass %, or 0.5 to 50 mass %. In this specification, the solid content means all components in the underlayer coating forming composition from which the solvent component is excluded. The proportion of the component having an epoxy group (a polymer compound, a compound) and the component having a phenolic hydroxyl group, a carboxyl group, a protected carboxyl group or an acid anhydride structure (a polymer compound, a compound) in the solid content is 70 mass % or more, for example 80 to 100 mass %, or 80 to 99 mass %, or 90 to 99 mass %.

The underlayer coating forming composition according to the present invention contains a polymer compound having an epoxy group and a polymer compound having a phenolic hydroxyl group, a carboxyl group, a protected carboxyl group or an acid anhydride structure.

As the polymer compound having an epoxy group, any polymer having an epoxy group can be used without any limitation. Such a polymer compound can be produced by addition polymerization by using a addition polymerizable monomer having an epoxy group, or by reaction of a polymer compound having a hydroxyl group with a compound having an epoxy group such as epichlorohydrin, glycidyl tosylate or the like.

The addition polymerizable monomer having an epoxy group includes glycidyl acrylate, glycidyl methacrylate or the like. And, the polymer compound having an epoxy group is produced from only one of the monomers or from a combination of two or more monomers.

In addition, the polymer compound having an epoxy group in the present invention may be a polymer compound produced by polymerization of the addition polymerizable monomer having an epoxy group with other addition polymerizable monomer.

The other addition polymerizable monomer includes an acrylate compound, a methacrylate compound, an acrylamide compound, a methacrylamide compound, a vinyl compound, a styrene compound, a maleimide compound, maleic anhydride, acrylonitrile and the like.

The acrylate compound includes methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamanthyl acrylate, 2-methoxybutyl-2-adamantyl acrylate, 8-methyl-8-tricyclodecyl acrylate, 8-ethyl-8-tricyclodecyl acrylate, 5-acryloyloxy-6-hydroxynorbornene-2-carboxylic-6-lactone and the like.

The methacrylate compound includes ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxy polyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamanthyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone and the like.

In addition, the acrylate compound and methacrylate compound include the compounds of formulae (a) to (g)

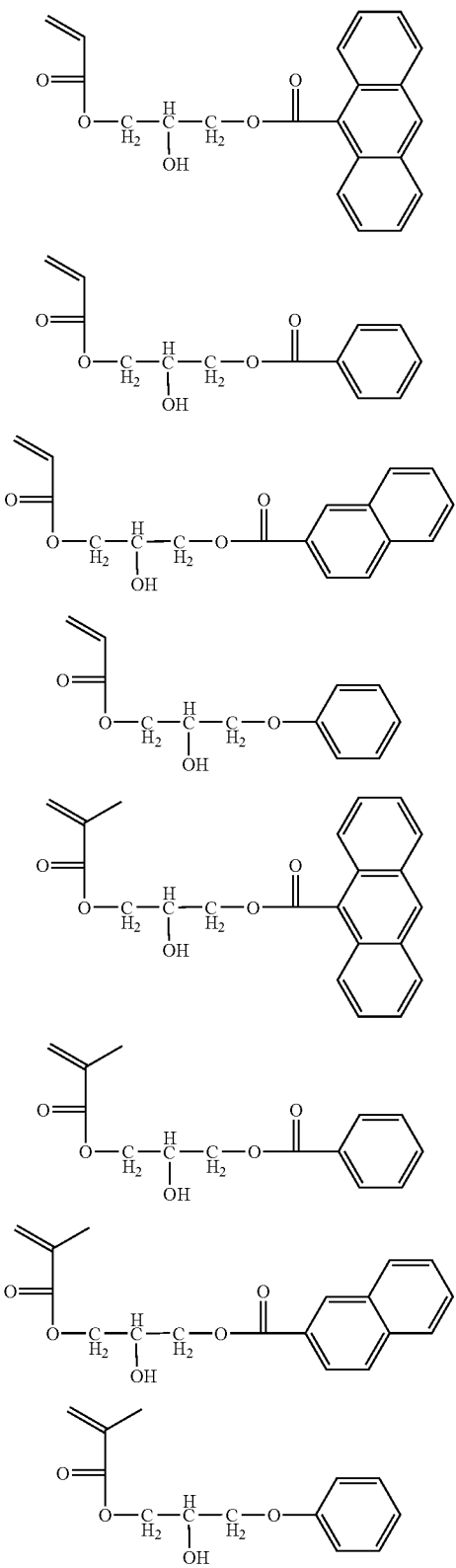

The acrylamide compound includes acrylamide, N-methyl acrylamide, N-ethyl acrylamide, N-benzyl acrylamide, N-phenyl acrylamide, N,N-dimethyl acrylamide and the like.

The methacrylamide compound includes methacrylamide, N-methyl methacrylamide, N-ethyl methacrylamide, N-benzyl methacrylamide, N-phenyl methacrylamide, N,N-dimethyl methacrylamide and the like.

The vinyl compound includes vinyl ether, methyl vinyl ether, benzyl vinyl ether, 2-hydroxyethyl vinyl ether, phenyl vinyl ether, propyl vinyl ether and the like.

The styrene compound includes styrene, methyl styrene, chloro styrene, bromo styrene and the like.

The maleimide compound includes maleimide, N-methyl maleimide, N-phenyl maleimide, N-cyclohexyl maleimide and the like.

The polymer compound having an epoxy group can be also produced by reaction of a polymer compound having a hydroxyl group with a compound having an epoxy group such as epichlorohydrin, glycidyl tosylate or the like. For example, epoxy phenol novolak produced from phenol novolak and epichlorohydrin and further epoxy cresol novolak, epoxy naphthol novolak and the like can be mentioned.

Specific examples of the polymer compound having an epoxy group used for the underlayer coating forming composition according to the present invention include for example polyglycidyl acrylate, polyglycidyl methacrylate, a copolymer of glycidyl methacrylate and benzyl methacrylate, a copolymer of glycidyl acrylate and ethyl methacrylate, a copolymer of glycidyl methacrylate and 2-hydroxypropyl methacrylate, a copolymer of glycidyl methacrylate and benzyl methacrylate and 2-hydroxyethyl methacrylate, a copolymer of glycidyl methacrylate and styrene, a copolymer of glycidyl methacrylate and styrene and 2-hydroxy ethyl acrylate and the like, As the polymer compound having a phenolic hydroxyl group, a carboxyl group, a protected carboxyl group or an acid anhydride structure, any polymer compound having a phenolic hydroxyl group, a carboxyl group, a protected carboxyl group or an acid anhydride structure may be used without any limitation. In the present invention, the protected carboxyl group includes a hemiacetal ester form obtained from carboxyl group with an alkyl vinyl ether, an amide form obtained from carboxyl group with an amine, an ester form obtained from carboxyl group with an alcohol, a tert-butyl ester form obtained from carboxyl group with isobutene, or a silyl ester form obtained from carboxyl group with a silyl halide compound, and the like. The protected carboxyl group includes for example the groups of formulae (i) to (m)

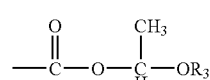 (i)

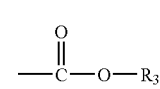 (j)

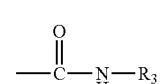 (k)

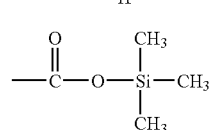 (l)

-continued

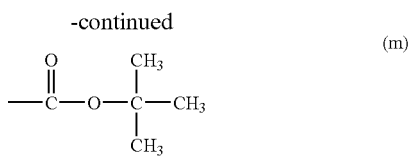
(m)

wherein $R_3$ is $C_{1-6}$ alkyl group, benzyl group or phenyl group. $R_3$ includes for example methyl group, ethyl group, isopropyl group and n-butyl group, etc.

Such a polymer compound can be produced by addition polymerization by using an addition polymerizable monomer having a phenolic hydroxyl group, a carboxyl group, a protected carboxyl group or an acid anhydride structure.

The addition polymerizable monomer having a phenolic hydroxyl group includes hydroxy styrene and the like.

The addition polymerizable monomer having a carboxyl group includes acrylic acid, methacrylic acid, vinyl benzoate, vinyl acetate and the like.

The addition polymerizable monomer having a protected carboxyl group includes methacrylic acid hemiacetal ester compounds such as 1-methoxyethyl methacrylate, 1-ethoxyethyl methacrylate, 1-isopropoxyethyl methacrylate, etc., acrylic acid hemiacetal ester compounds such as 1-methoxyethyl acrylate, 1-tert-butoxyethyl acrylate, 1-isopropoxyethyl acrylate, etc., maleic acid hemiacetal ester compounds, fumaric acid hemiacetal ester compounds, itaconic acid hemiacetal ester compounds, acrylamide compounds, methacrylamide compounds, acrylates, methacrylates, tert-butyl methacrylate, tert-butyl acrylate, trimethyl silyl acrylate, trimethyl silyl methacrylate, and the like.

The addition polymerizable monomer having an acid anhydride structure includes maleic anhydride, or methacrylate, acrylate or vinyl compound having non-cyclic anhydride, and the like.

In addition, the polymer compound having a phenolic hydroxyl group, a carboxyl group, a protected carboxyl group or an acid anhydride structure can be produced from only one of the monomers or from a combination of two or more monomers.

Further, as the polymer compound having a phenolic hydroxyl group, a carboxyl group, a protected carboxyl group or an acid anhydride structure, polymer compounds produced by polymerization of the above-mentioned addition polymerizable monomer having a phenolic hydroxyl group, a carboxyl group, a protected carboxyl group or an acid anhydride structure with other addition polymerizable monomer can be used.

The other addition polymerizable monomer includes the acrylate compound, methacrylate compound, acrylamide compound, methacrylamide compound, vinyl compound, styrene compound, maleimide compound, maleic anhydride, acrylonitrile and the like, as mentioned above.

Specific examples of the polymer compound having a phenolic hydroxyl group, a carboxyl group, a protected carboxyl group or an acid anhydride structure used for the underlayer coating forming composition according to the present invention include for example poly(acrylic acid), poly(methacrylic acid), a copolymer of acrylic acid and benzyl methacrylate, poly(4-hydroxystyrene), a copolymer of methacrylic acid and methyl methacrylate and 2-hydroxyethyl acrylate, a copolymer of methacrylic acid and benzyl methacrylate and 2-hydroxyethyl acrylate, a copolymer of 4-hydroxystyrene and ethyl methacrylate and 2-hydroxyethyl acrylate, a copolymer of 4-hydroxystyrene and ethyl methacrylate, a copolymer of 4-hydroxystyrene and styrene, a copolymer of 1-n-propoxyethyl methacrylate and benzyl methacrylate, a copolymer of 1-n-propoxyethyl acrylate and benzyl methacrylate and 2-hydroxyethyl acrylate, a copolymer of maleic anhydride and ethyl methacrylate, a copolymer of 4-hydroxystyrene and maleic anhydride and isopropyl acrylate, and the like.

The polymer compound having a phenolic hydroxyl group, includes a phenol novolak, cresol novolak, naphthol novolak and the like in addition to the above mentioned ones.

The underlayer coating forming composition of the present invention comprises the polymer compound having an epoxy group and the polymer compound having a phenolic hydroxyl group, a carboxyl group, a protected carboxyl group or an acid anhydride structure in a content proportion: the polymer compound having an epoxy group/the polymer compound having a phenolic hydroxyl group, a carboxyl group, a protected carboxyl group or an acid anhydride structure that is shown in mass ratio of for example 10/1 to 1/10, preferably 5/1 to 1/5, or 3/1 to 1/3. In addition, the molecular weight of the polymer compounds contained in the underlayer coating forming composition according to the present invention is in the term of weight average molecular weight, 1000 to 500000, preferably 1000 to 200000, or 3000 to 150000, or 3000 to 50000.

The underlayer coating forming composition of the present invention comprises the polymer compound having an epoxy group and a phenolic hydroxyl group, a carboxyl group, a protected carboxyl group or an acid anhydride structure.

Such a polymer compound can be produced by polymerization of an addition polymerizable monomer having a phenolic hydroxyl group, a carboxyl group, a protected carboxyl group or an acid anhydride structure with an addition polymerizable monomer having an epoxy group. As the addition polymerizable monomers, the above-mentioned monomers can be mentioned, respectively.

Specific examples of the polymer compound having an epoxy group and a phenolic hydroxyl group, a carboxyl group, a protected carboxyl group or an acid anhydride structure used in the underlayer coating forming composition of the present invention include for example a copolymer of acrylic acid and glycidyl acrylate, a copolymer of methacrylic acid and glycidyl methacrylate, a copolymer of methacrylic acid and glycidyl methacrylate and benzyl methacrylate, a copolymer of 4-hydroxystyrene and glycidyl methacrylate, a copolymer of 4-hydroxystyrene and methacrylic acid and glycidyl methacrylate, a copolymer of styrene and maleic anhydride and glycidyl methacrylate, a copolymer of glycidyl methacrylate and 1-n-propoxyethyl methacrylate, a copolymer of glycidyl methacrylate and benzyl methacrylate and 1-n-propoxyethyl methacrylate, and the like.

The molecular weight of the polymer compounds contained in the underlayer coating forming composition according to the present invention is in the term of weight average molecular weight, 1000 to 500000, preferably 1000 to 200000, or 3000 to 150000, or 3000 to 50000.

The polymer compounds used in the present invention produced from the addition polymerizable monomers may be any of random polymers, block polymers or graft polymers. The polymer compounds can be produced by any methods such as radical polymerization, anionic polymerization, cationic polymerization or the like. As the type of polymerization, various methods such as solution polymerization, suspension polymerization, emulsion polymerization or bulk polymerization, etc. can be mentioned.

The underlayer coating forming composition according to the present invention contains a polymer compound having an epoxy group and a compound with a molecular weight of 2000 or less having at least two phenolic hydroxyl groups, carboxyl groups, protected carboxyl groups or acid anhydride structures.

As the polymer compound having an epoxy group, the above-mentioned polymer compounds can be used.

The compound with a molecular weight of 2000 or less having at least two phenolic hydroxyl groups includes for example a hydroxystyrene oligomer, a substituted bi-phenol compound, a substituted tris-phenol compound, a methylolated phenol compound, a methylolated bisphenol compound, a substituted phenol novolak and a substituted cresol novolak.

The compound with a molecular weight of 2000 or less having at least two carboxyl groups includes for example isophthalic acid, terephthalic acid, 1,2,4-trimellitic acid, pyromellitic acid, adipic acid, maleic acid, itaconic acid, fumaric acid, butane tetracarboxylic acid and the like. In addition, the compound of formula (1)

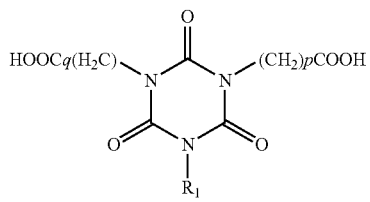

(1)

may be mentioned. In the formula, p and q is a number of 1 to 6, $R_1$ is hydrogen atom, $C_{1-6}$ alkyl group, $C_{3-6}$ alkenyl group, benzyl group, phenyl group or —$(CH_2)_r$COOH wherein r is a number of 1 to 6. $R_1$ is for example methyl group, ethyl group, isopropyl group, n-butyl group, and 2-propenyl group, etc. Specific examples of the compounds of formula (1) are for example tris(2-carboxyethyl) isocyanuric acid, tris(3-carboxypropyl) isocyanuric acid and the like.

The compound with a molecular weight of 2000 or less having at least two acid anhydride structures includes for example phthalic anhydride, tetrahydrophthalic anhydride, hexahydrophthalic anhydride, methyltetrahydrophthalic anhydride, methylhexahydrophthalic anhydride, methyl nadic anhydride, dodecylsuccinic anhydride, chlorendic anhydride, pyromellitic anhydride, benzophenone tetracarboxylic anhydride, ethylene glycol bis(anhydrotrimellitate), methylcyclohexene tetracarboxylic anhydride, trimellitic anhydride, polyazelaic polyanhydride and the like.

The compound with a molecular weight of 2000 or less having at least two protected carboxyl groups includes for example terephthalic acid, trimellitic acid, pyromellitic acid, isophthalic acid, tris(2-carboxyethyl) isocyanuric acid, tris(3-carboxypropyl) isocyanuric acid, adipic acid, maleic acid, itaconic acid, fumaric acid, butane tetracarboxylic acid and the like which are converted with propyl vinyl ether into a form of hemiacetal.

These compounds can be used alone or in a combination of two or more compounds.

The underlayer coating forming composition of the present invention comprises the polymer compound having an epoxy group and the compound with a molecular weight of 2000 or less having at least two phenolic hydroxyl groups, carboxyl groups, protected carboxyl groups or acid anhydride structures in a content proportion: the polymer compound having an epoxy group/the compound with a molecular weight of 2000 or less having at least two phenolic hydroxyl groups, carboxyl groups, protected carboxyl groups or acid anhydride structures that is shown in mass ratio of for example 10/1 to 1/10, preferably 5/1 to 1/5, or 3/1 to 1/3.

In addition, the underlayer coating forming composition of the present invention comprises the compound with a molecular weight of 2000 or less having at least two epoxy groups and the polymer compound having a phenolic hydroxyl group, a carboxyl group, a protected carboxyl group or an acid anhydride structure.

As the polymer compound having a phenolic hydroxyl group, a carboxyl group, a protected carboxyl group or an acid anhydride structure, the above-mentioned polymer compounds can be used.

The compound with a molecular weight of 2000 or less having at least two epoxy groups includes for example triglycidyl-p-aminophenol, tetraglycidyl meta-xylene diamine, tetraglycidyl diamino diphenylmethane, tetraglycidyl-1,3-bisaminomethylcyclohexane, bisphenol-A-diglycidyl ether, bisphenol-S-diglycidyl ether, resorcinol diglycidyl ether, diglycidyl phthalate, neopentyl glycol diglycidyl ether, polypropylene glycol diglycidyl ether, cresol novolak polyglycidyl ether, tetrabromo bisphenol-A-diglycidyl ether, bisphenol hexafluoro acetone diglycidyl ether, glycerin triglycidyl ether, pentaerythritol diglycidyl ether and the like. In addition, the compound of formula (2)

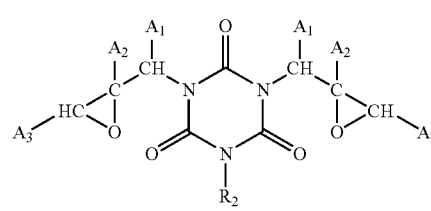

(2)

may be mentioned. In this formula, wherein $A_1$, $A_2$ and $A_3$ each are hydrogen atom, methyl group or ethyl group, $R_2$ is hydrogen atom, $C_{1-6}$ alkyl group, $C_{3-6}$ alkenyl group, benzyl group, phenyl group or a group of formula (3). $R_2$ is for example methyl group, ethyl group, isopropyl group, n-butyl group, 2,3-epoxypropyl group and 2-propenyl group, etc.

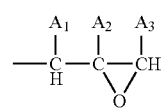

(3)

Specific examples of the compound formula (2) include for example tris(2,3-epoxypropyl) isocyanurate, monoallyl diglycidyl isocyanurate and the like. These compounds can be used alone or in a combination of two or more compounds.

The underlayer coating forming composition of the present invention comprises the compound with a molecular weight of 2000 or less having at least two epoxy groups and the polymer compound having a phenolic hydroxyl group, a carboxyl group, a protected carboxyl group or an acid anhydride structure in a content proportion: the compound with a molecular weight of 2000 or less having at least two epoxy groups/the polymer compound having a phenolic hydroxyl group, a carboxyl group, a protected carboxyl group or an acid anhydride structure that is shown in mass ratio of for example 10/1 to 1/10, preferably 5/1 to 1/5, or 3/1 to 1/3.

As mentioned above, the underlayer coating forming composition of the present invention comprises a component having an epoxy group (a polymer compound, a compound) and a component having a phenolic hydroxy group, a carboxyl group, a protected carboxyl group or an acid anhydride structure (a polymer compound, a compound). When this composition is applied on a semiconductor substrate and baked to form an underlayer coating, the epoxy group is reacted with the phenolic hydroxy group, carboxyl group, protected carboxyl group or acid anhydride structure, and thereby the ring-opening reaction of the epoxy group occurs. In addition, the protected carboxyl group provides a carboxyl group during the baking, and then the reaction thereof with an epoxy group occurs. That is, the polymer compounds are reacted each other or the polymer compound is reacted with the compound with a molecular weight of 2000 or less, and the result of it, three-dimensional crosslinked structure formed between the polymer compounds or from the polymer compound and the compound with a molecular weight of 2000 or less. And, due to the crosslinked structure, the formed underlayer coating becomes tight, and comes to have a low solubility in an organic solvent generally used for the photoresist composition applied on the underlayer coating, such as ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methylpyruvate, ethyl lactate, butyl lactate, etc. Thus, the underlayer coating formed from the underlayer coating forming composition according to the present invention causes no intermixing with photoresists.

In addition, as the reaction of an epoxy group with a phenolic hydroxy group, a carboxyl group, a protected carboxyl group or an acid anhydride structure proceeds easily under a baking condition, the reaction does not require any catalyst. Therefore, for the underlayer coating composition of the present invention, it is not required to add any sulfonic acid compound that has been generally used as a crosslinking catalyst in the composition for forming the prior crosslinkable underlayer coating.

The compound with a molecular weight of 2000 or less is required to contain at least two epoxy groups, phenolic hydroxy groups, carboxyl groups, protected carboxyl groups or acid anhydride structures for forming crosslinkage structure. The compounds having three or more epoxy groups, phenolic hydroxy groups, carboxyl groups, protected carboxyl groups or acid anhydride structures are preferably used.

The underlayer coating forming composition according to the present invention may contain further light absorbing compounds, rheology controlling agents, adhesion auxiliaries, surfactants, etc. in addition to the above described ones, if necessary.

The light absorbing compound that can be used are any compounds having a high absorption for light at photosensitive characteristic wavelength region of photosensitive components in a photoresist layer provided on the underlayer coating, and prevents standing wave caused by reflection from a substrate or random reflection due to unevenness on the substrate surface, it can be used without any limitation. When the light absorbing compound is added to the underlayer coating forming composition, the resulting underlayer coating has a high effect of preventing reflected light and excellent function as an anti-reflective coating.

As the light absorbing compounds, can be used benzophenone compounds, benzotriazole compounds, azo compounds, naphthalene compounds, anthracene compounds, anthraquinone compounds, triazine compounds, triazine trione compounds, quinoline compounds and the like. Naphthalene compounds, anthracene compounds, triazine compounds and triazine trione compounds are preferably used. In addition, it is preferable that the light absorbing compound can be reacted with the above-mentioned component having an epoxy group, and therefore compounds having a carboxyl group or a phenolic hydroxyl group are preferably used. Specific examples include for example 1-naphthalene carboxylic acid, 2-naphthalene carboxylic acid, 1-naphthol, 2-naphthol, naphthyl acetate, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-carboxylic acid, 1-anthracene carboxylic acid, 1-hydroxyanthracene, 1,2,3-anthracenetriol, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, 2,4,6-tribromo-3-hydroxybenzoic acid and the like.

These light absorbing compounds can be used alone or in a combination of two or more compounds. When the light absorbing compounds are contained in the underlayer coating forming composition of the present invention, the blending amount is 30 mass % or less, for example 1 to 20 mass % or 1 to 10 mass % in the solid content.

The rheology controlling agents are added mainly aiming at increasing the flowability of the underlayer coating forming composition and in particular in the baking step, increasing fill property of the underlayer coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyidecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are added in proportions of usually less than 10 mass % in the solid content of the underlayer coating forming composition.

The adhesion auxiliaries are added mainly for the purpose of increasing the adhesion between a substrate, or an antireflective coating or a photoresist and an underlayer coating formed from an underlayer coating forming composition, in particular preventing the detachment in development. Specific examples thereof include chlorosilanes such as trimethylchlorosilane, dimethylvinylchlorosilane, methyl diphenylchlorosilane or chloromethyldimethyl chlorosilane; alkoxysilanes such as dimethyldiethoxysilane, methyldimethoxysilane, dimethylvinylethoxysilane, γ-methacryloxypropyltrimethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxysilane, γ-glycidoxypropyltrimethoxysilane or γ-methacryloxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea. The adhesion auxiliaries are added in proportions of usually less than 2 mass %, in the solid content of the underlayer coating forming composition.

The underlayer coating forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 1 mass % or less in the solid content of the underlayer coating forming composition according to the present invention. The surfactants may be added singly or two or more of them may be added in combination.

In the underlayer coating forming composition of the present invention, several solvents for dissolving the solid contents such as the above-mentioned polymer compounds and the like can be used. As the solvents, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methylpyruvate, ethyl pyruvate, ethyl acetate, butyl acetate, ethyl lactate, butyl lactate, etc. These solvents may be used singly or in combination of two or more of them. Further, high boiling solvents such as propylene glycol monobutyl ether or propylene glycol monobutyl ether acetate, etc. may be mixed.

Hereinafter, the utilization of the underlayer coating forming composition of the present invention is described.

On a semiconductor substrate (for example, silicon/silicon dioxide coat substrate, silicon nitride substrate, glass substrate, ITO substrate or the like), the underlayer coating forming composition of the present invention is coated by a suitable coating method, for example, with a spinner, a coater or the like, and thereafter the substrate is baked to fabricate an underlayer coating. The conditions of baking are suitably selected from baking temperature of 80 to 250° C. and baking time of 0.3 to 60 minutes. The thickness of the underlayer coating is for example 0.01 to 3.0 μm, or for example 0.03 to 1.0 μm.

Next, a photoresist is formed directly on the underlayer coating or after forming an anti-reflective coating, and then a substrate processing is carried out by exposure to light, development and dry etching.

The underlayer coating formed from the underlayer coating forming composition according to the present invention is completely removed finally after exposure to light and development of photoresist, and substrate processing, and the like in a process of manufacture of semiconductor device. The removal is generally carried out by dry etching.

As photoresist to be coated and formed as an upper layer of the underlayer coating of the present invention, any of negative type and positive type photoresists may be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned. And, a photoresist is formed, thereafter it can be exposed to light through a predetermined mask, developed, rinsed and dried to obtain a photoresist pattern. If necessary, post exposure bake (PEB) may be performed.

As developers for positive type photoresists having the underlayer coating formed by use of the underlayer coating forming composition for lithography according to the present invention, the following aqueous solutions of alkalis can be used: inorganic alkali such as sodium hydroxide, potassium hydroxide, sodium carbonate, sodium silicate, sodium metasilicate or ammonia water, etc., primary amines such as ethylamine or n-propylamine, etc., secondary amines such as diethylamine or di-n-butylamine, etc., tertiary amines such as triethylamine or methyldiethylamine, etc., alcohol amines such as dimethylethanol amine or triethanol amine, etc., quaternary ammonium salt such as tetramethylammonium hydroxide, tetraethylammonium hydroxide or choline, etc., cyclic amine such as pyrrole or piperidine, etc. Furthermore, a suitable amount of alcohols such as isopropyl alcohol or surfactants such as anionic surfactant can be added to the above-mentioned aqueous solution of alkalis. Among them, preferable developers are quaternary ammonium salts, and more preferably tetramethylammonium hydroxide and choline.

Before or after forming the underlayer coating layer of the present invention on a semiconductor substrate, an organic anti-reflective coating layer may be applied and formed. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a resin and a solvent, one containing as main components a resin having a light absorbing group through chemical bond, a crosslinking agent and a solvent, one containing as main components a light absorbing compound, a crosslinking agent and a solvent, one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The resins include polyesters, polyimides, polystyrenes, novolak resins, polyacetal resins, acrylic resins, and the like. The resins having a light absorbing group through chemical bond include resins having a light absorbing aromatic ring structure such as anthracene ring, naphthalene ring, benzene ring, quinoline ring, quinoxaline ring or thiazole ring.

The substrates on which the underlayer coating forming composition of the present invention is applied may be substrates on which an inorganic anti-reflective coating is formed by CVD method or the like, and the underlayer coating forming composition of the present invention can be coated thereon.

The underlayer coating formed from the underlayer coating forming composition of the present invention may contain an absorption for light used in the lithography process. In such a case, the underlayer coating can be used as a layer having a prevent effect against light reflected from the substrate, that is, as an anti-reflective coating.

In case where the underlayer coating is used as an anti-reflective coating in the lithography process by use of irradiation light of KrF excimer laser beam (wavelength 248 nm), it is preferable that the solid content in the underlayer coating forming composition contains a component containing an anthracene ring or a naphthalene ring. In case where the underlayer coating is used as an anti-reflective coating in the lithography process by use of irradiation light of ArF excimer laser beam (wavelength 193 nm), it is preferable that the solid content in the underlayer coating forming composition contains a component containing a benzene ring. In case where the underlayer coating is used as an anti-reflective coating in the lithography process by use of irradiation light of F2 excimer laser beam (wavelength 157 nm), it is preferable that the solid content in the underlayer coating forming composition contains a component containing a bromine atom or an iodine atom.

Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, or as a barrier layer for reducing any poisoning effect of the photoresist layer by the semiconductor substrate dielectric layer.

In addition, the underlayer coating formed from the underlayer coating forming composition can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Synthetic Example 1

In 64 g of ethyl lactate, 5.44 g of benzyl methacrylate, 5.0 g of glycidyl methacrylate and 5.6 g of 2-hydroxyethyl methacrylate were dissolved, then the temperature of the reaction solution was raised to 70° C. and at the same time nitrogen was flowed to the reaction solution. Thereafter 0.2 g of azobisisobutyronitrile as a polymerization initiator was added. After stirring under nitrogen atmosphere for 24 hours, 0.05 g of 4-methoxyphenol as a short-stop was added to obtain a solution containing a copolymer of benzyl methacrylate, glycidyl methacrylate and 2-hydroxyethyl methacrylate. GPC analysis of the resulting polymer compound showed that it had a weight average molecular weight of 25000 in terms of standard polystyrene.

Synthetic Example 2

In 64 g of ethyl lactate, 5.44 g of benzyl methacrylate and 10.6 g of glycidyl methacrylate were dissolved, then the temperature of the reaction solution was raised to 70° C. and at the same time nitrogen was flowed to the reaction solution. Thereafter 0.2 g of azobisisobutyronitrile as a polymerization initiator was added. After stirring under nitrogen atmosphere for 24 hours, 0.05 g of 4-methoxyphenol as a short-stop was added to obtain a solution containing a copolymer of benzyl methacrylate and glycidyl methacrylate. GPC analysis of the resulting polymer compound showed that it had a weight average molecular weight of 22000 in terms of standard polystyrene.

Synthetic Example 3

In 64 g of ethyl lactate, 5.44 g of benzyl methacrylate, 5.3 g of methacrylic acid and 5.3 g of glycidyl methacrylate were dissolved, then the temperature of the reaction solution was raised to 70° C. and at the same time nitrogen was flowed to the reaction solution. Thereafter 0.2 g of azobisisobutyronitrile as a polymerization initiator was added. After stirring under nitrogen atmosphere for 24 hours, 0.05 g of 4-methoxyphenol as a short-stop was added to obtain a solution containing a copolymer of benzyl methacrylate, methacrylic acid and glycidyl methacrylate. GPC analysis of the resulting polymer compound showed that it had a weight average molecular weight of 114000 in terms of standard polystyrene.

Synthetic Example 4

In 64 g of ethyl lactate, 16 g of glycidyl methacrylate was dissolved, then the temperature of the reaction solution was raised to 70° C. and at the same time nitrogen was flowed to the reaction solution. Thereafter 0.2 g of azobisisobutyronitrile as a polymerization initiator was added. After stirring under nitrogen atmosphere for 24 hours, 0.05 g of 4-methoxyphenol as a short-stop was added to obtain a solution containing polyglycidyl methacrylate. GPC analysis of the resulting polymer compound showed that it had a weight average molecular weight of 20000 in terms of standard polystyrene.

Synthetic Example 5

In 80 g of propylene glycol monomethyl ether, 10 g of cresol novolak resin (manufactured by Asahi Chiba Co., Ltd., trade name: ECN1299, weight average molecular weight: 3900) was dissolved. To the resulting solution, 9.7 g of 9-anthracene carboxylic acid and 0.26 g of benzyl triethyl ammonium chloride were added, then the reaction was carried out at 105° C. for 24 hours to obtain a solution containing the polymer compound of formula (4). GPC analysis of the resulting polymer compound showed that it had a weight average molecular weight of 5600 in terms of standard polystyrene.

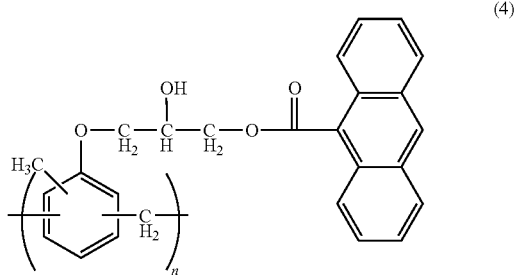

(4)

Example 1

0.3 g of tris(2-carboxyethyl)isocyanurate was mixed with 6 g of a solution containing 1.2 g of the polymer compound obtained in Synthesis Example 1, 28.5 g of ethyl lactate was added thereto. Thereafter, the resulting solution was filtered through a micro filter made of polyethylene having a pore diameter of 0.10 μm, and then filtered through a micro filter made of polyethylene having a pore diameter of 0.05 μm to prepare an underlayer coating forming composition solution.

Example 2

0.3 g of tris(2-carboxyethyl)isocyanurate was mixed with 6 g of a solution containing 1.2 g of the polymer compound obtained in Synthesis Example 2, 28.5 g of ethyl lactate was added thereto. Thereafter, the resulting solution was filtered similarly to the procedure in Example 1 to prepare an underlayer coating forming composition solution.

Example 3

0.8 g of poly(acrylic acid) was mixed with 0.7 g of tris(2, 3-epoxypropyl)isocyanurate, 28.5 g of ethyl lactate was added thereto. Thereafter, the resulting solution was filtered similarly to the procedure in Example 1 to prepare an underlayer coating forming composition solution.

Example 4

To 7.5 g of a solution containing 1.5 g of the polymer compound obtained in Synthesis Example 3, 22.5 g of ethyl lactate was added. Thereafter, the resulting solution was filtered similarly to the procedure in Example 1 to prepare an underlayer coating forming composition solution.

Example 5

3.75 g of a solution containing 0.75 g of the polymer compound obtained in Synthesis Example 4 was mixed with 0.75 g of poly(acrylic acid), 25.5 g of ethyl lactate was added thereto. Thereafter, the resulting solution was filtered similarly to the procedure in Example 1 to prepare an underlayer coating forming composition solution.

Comparative Example 1

To 10 g of a solution containing 2 g of the polymer compound obtained in Synthesis Example 5, 0.53 g of hexamethoxy methyl melamine as a crosslinking agent and 0.05 g of p-toluene sulfonic acid monohydrate were mixed, and the resulting solution was dissolved in 14.3 g of ethyl lactate, 1.13 g of propylene glycol monomethyl ether and 2.61 g of cyclohexanone to obtain 9% solution. Thereafter, the resulting solution was filtered similarly to the procedure in Example 1 to prepare an underlayer coating forming composition solution.

Dissolution Test in Organic Solvent

The solutions obtained in Examples 1 to 5 and Comparative Example 1 were coated on silicon wafers by means of a spinner. The coated silicon wafers were baked at 205° C. for 1 minute on a hot plate to form underlayer coatings for lithography (film thickness 0.23 μm). The underlayer coatings were dipped in a solvent used for photoresists, for example ethyl lactate and propylene glycol monomethyl ether and as a result it was confirmed that the resulting underlayer coatings were insoluble in these solvents.

Test of Intermixing

The solutions obtained in Examples 1 to 5 and Comparative Example 1 were coated on silicon wafers by means of a spinner. The coated silicon wafers were baked at 205° C. for 1 minute on a hot plate to form underlayer coatings, and the film thickness thereof was measured (film thickness 0.23 μm). On each underlayer coating was coated a commercially available photoresist solution (manufactured by Sumitomo Chemical Co., Ltd.; trade name: PAR710, etc.) by means of a spinner. The coated wafers were heated at 90° C. for 1 minute on a hot plate. After exposure of the photoresists to light, post exposure bake (PEB) was performed at 90° C. for 1.5 minute. After developing the photoresists, the film thickness of the underlayer coatings was measured and it was confirmed that no intermixing occurred between the underlayer coatings obtained from solutions prepared in Examples 1 to 5 and Comparative Example 1 and the photoresist layers.

Measurement of Optical Parameter

The underlayer coating forming composition solution prepared in Example 1 was coated on a silicon wafer by means of a spinner. The coated silicon wafer was baked at 205° C. for 1 minute on a hot plate to form an underlayer coating (film thickness 0.08 μm). On the underlayer coating, refractive index (n) and attenuation coefficient (k) at a wavelength of 193 nm were measured with a spectroscopic ellipsometer. As a result of it, refractive index (n) was 1.82 and attenuation coefficient (k) was 0.32.

Measurement of Dry Etching Rate

The underlayer coating forming composition solution prepared in Example 1 was coated on a silicon wafer by means of a spinner. The coated silicon wafer was baked at 205° C. for 1 minute on a hot plate to form an underlayer coating. Then, dry etching rate on underlayer coating was measured with RIE system ES401 manufactured by Nippon Scientific Co., Ltd. under the condition in which $CF_4$ was used as dry etching gas. Similarly, a photoresist solution (manufactured by Sumitomo Chemical Co., Ltd., trade name: PAR710) was coated on a silicon wafer by means of a spinner, and heated to form a photoresist coating. Then, dry etching rate on the photoresist was measured with RIE system ES401 manufactured by Nippon Scientific Co., Ltd. under the condition in which $CF_4$ was used as dry etching gas. Comparison of the dry etching rate between the underlayer coating in Example 1 and the photoresist (trade name: PAR710) manufactured by Sumitomo Chemical Co., Ltd. showed that the dry etching rate of the underlayer coating was 1.3 time that of the photoresist.

As mentioned above, present invention relates to an underlayer coating formed by use of crosslinking reaction that dose not require a strong acid catalyst, and an underlayer coating forming composition for forming the underlayer coating.

The underlayer coating forming composition of the present invention contains no strong acid catalyst, and therefore it is excellent in shelf stability.

The underlayer coating forming composition of the present invention can provide an excellent underlayer coating that has a high dry etching rate compared with photoresists, and cause no intermixing with photoresists. In addition, the underlayer coating of the present invention can be used as an anti-reflective coating, a flattening coating, or a coating for preventing contamination of a photoresist layer. Consequently, the present invention enables the formation of photoresist pattern in lithography process of the production of semiconductor device to be carried out easily and in a high accuracy.

The invention claimed is:

1. A resist underlayer anti-reflective coating forming composition for use in a lithography process of manufacture of a semiconductor device comprising:
   a polymer compound produced by addition polymerization having an epoxy group;
   a compound with a molecular weight of 2000 or less having at least two carboxyl groups, or protected carboxyl groups;
   a solvent; and
   a light absorbing compound,
   wherein the resist underlayer anti-reflective coating forming composition contains no strong acid catalyst.

2. A resist underlayer anti-reflective coating forming composition for use in a lithography process of manufacture of a semiconductor device comprising:
   an s-triazine trione skeleton compound with a molecular weight of 2000 or less having at least two epoxy groups;
   a polymer compound having a phenolic hydroxyl group, a carboxyl group, a protected carboxyl group or an acid anhydride structure; and
   a solvent,
   wherein the resist underlayer anti-reflective coating forming composition contains no strong acid catalyst.

3. The underlayer coating forming composition according to claim 2, wherein the polymer compound having a carboxyl group is a compound having acrylic acid or methacrylic acid as a unit structure.

4. The underlayer coating forming composition according to claim 2, wherein the polymer compound having a phenolic hydroxyl group is a compound having hydroxystyrene as a unit structure.

5. The underlayer coating forming composition according to claim 2, wherein the compound with a molecular weight of 2000 or less having at least two epoxy groups is a compound having at least three epoxy groups and no aromatic ring structure.

6. The underlayer coating forming composition according to claim 2, wherein the compound with a molecular weight of 2000 or less having at least two epoxy groups is a compound of formula (2)

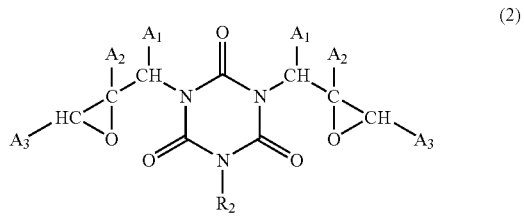

wherein $A_1$, $A_2$ and $A_3$ each are hydrogen atom, methyl group or ethyl group, $R_2$ is hydrogen atom, $C_{1-6}$ alkyl group, $C_{3-6}$ alkenyl group, benzyl group, phenyl group or a group of formula (3)

7. A method for forming photoresist patterns for use in manufacture of semiconductor devices, comprising
   coating an underlayer forming composition on a semiconductor substrate, and baking it to form an underlayer coating,
   forming a photoresist layer on the underlayer coating,
   exposing the semiconductor substrate covered with the underlayer coating and the photoresist layer to light, and
   developing the photoresist layer after the exposure to light,
   wherein the underlayer forming composition comprises:
   a polymer compound produced by addition polymerization having an epoxy group;
   a compound with a molecular weight of 2000 or less having at least two carboxyl groups, or protected carboxyl groups; and
   a solvent,
   wherein the resist underlayer anti-reflective coating forming composition contains no strong acid catalyst.

8. The method for forming photoresist pattern according to claim 7, wherein the exposure to light is carried out with a light of a wavelength of 248 nm, 193 nm or 157 nm.

* * * * *